United States Patent
Yamamoto et al.

(10) Patent No.: US 8,269,462 B2
(45) Date of Patent: Sep. 18, 2012

(54) STATE MONITORING APPARATUS FOR ASSEMBLED BATTERY

(75) Inventors: Hiroyoshi Yamamoto, Nagoya (JP); Hiroshi Tamura, Nagoya (JP)

(73) Assignee: Denso Corporation, Kariya (JP)

( * ) Notice: Subject to any disclaimer, the term of this patent is extended or adjusted under 35 U.S.C. 154(b) by 268 days.

(21) Appl. No.: 12/845,063

(22) Filed: Jul. 28, 2010

(65) Prior Publication Data

US 2011/0025271 A1 Feb. 3, 2011

(30) Foreign Application Priority Data

Jul. 28, 2009 (JP) ................................. 2009-174923

(51) Int. Cl.
*H02J 7/00* (2006.01)
*H02J 9/00* (2006.01)
*H01M 10/34* (2006.01)
*G01N 27/416* (2006.01)

(52) U.S. Cl. ........ 320/132; 320/118; 320/124; 320/127; 320/149; 307/66; 429/60; 324/426

(58) Field of Classification Search .................... 320/132
See application file for complete search history.

(56) References Cited

U.S. PATENT DOCUMENTS

| 6,366,054 | B1 * | 4/2002 | Hoenig et al. | 320/132 |
| 6,621,250 | B1 * | 9/2003 | Ohkubo et al. | 320/136 |
| 6,639,385 | B2 * | 10/2003 | Verbrugge et al. | 320/132 |
| 6,891,352 | B2 * | 5/2005 | Miyazaki et al. | 320/118 |
| 7,009,401 | B2 * | 3/2006 | Kinoshita et al. | 324/430 |
| 7,248,020 | B2 * | 7/2007 | Hidaka et al. | 320/134 |
| 7,405,579 | B2 * | 7/2008 | Okamoto et al. | 324/713 |
| 2003/0076109 | A1 * | 4/2003 | Verbrugge et al. | 324/427 |

FOREIGN PATENT DOCUMENTS

JP 2002-042906 2/2002

* cited by examiner

*Primary Examiner* — Yalkew Fantu
(74) *Attorney, Agent, or Firm* — Nixon & Vanderhye PC

(57) ABSTRACT

The state monitoring apparatus includes a high-voltage side monitoring section having monitoring units assigned to respective unit batteries and a low-voltage side monitoring section having a control device. The monitoring units measures the voltages of the unit batteries upon reception of a voltage measurement command transmitted from the control device, and determines whether or not the measured voltages are within a predetermined range. This determination is transmitted to the control device. If this determination is negative, the control device limits a charge/discharge current of the assembled battery, and then causes the monitoring units to transmit the measured voltages.

8 Claims, 9 Drawing Sheets

STATE MONITORING APPARATUS FOR ASSEMBLED BATTERY

This application claims priority to Japanese Patent Application No. 2009-174923 filed on Jul. 28, 2009, the entire contents of which are hereby incorporated by reference.

BACKGROUND OF THE INVENTION

1. Field of the Invention

The present invention relates to a state monitoring apparatus for an assembled battery, the state monitoring apparatus including a high-voltage side monitoring section disposed in a high voltage system having an assembled battery constituted of a series connection of a plurality of battery cells to monitor the state of the assembled battery, and a low-voltage side monitoring section disposed in a low voltage system insulated from the high voltage system to monitor the state of the assembled battery through communication with the high-voltage side monitoring section.

2. Description of Related Art

It is known to provide a vehicle on which an electric motor is mounted as a vehicle main engine with an assembled battery constituted of a series connection of a plurality of battery cells as a high voltage battery to supply power to the motor. However, it may occur that remaining capacities of the battery cells differ from one another due to temperature variation among the battery cells and individual variation among the battery cells, causing variation in remaining capacity among the battery cells and accordingly voltage variation among the battery cells. When lithium batteries are used as the battery cells, if their remaining capacities increase excessively, that is, if the battery cells are overcharged, they are caused to deteriorate quickly. Accordingly, in this case, it is desirable to monitor the voltages of the battery cells.

Incidentally, since the high voltage battery is included in the high voltage system of a vehicle isolated from the low voltage system of the vehicle, it is necessary to transmit detection results by a voltage measuring means provided in the high voltage system to the low voltage system to monitor the state of the assembled battery on the side of the low voltage system. However, there is a problem that data amount and the time needed to transmit the detection results increase as the number of the battery cells constituting the high voltage battery increases.

To cope with this problem, there is proposed a technique in which when a battery voltage measuring device is activated, the measured voltages of all the battery cells are transmitted to the low voltage system, then the battery cells whose voltages are respectively at the maximum and minimum of all the battery cells are identified on the side of the low voltage system, and thereafter, the measured voltages of only the identified batteries are transmitted to the low voltage system at appropriate timings. For example, refer to Japanese Patent Application Laid-Open No. 2002-42906.

However, in the above technique, since most of the battery cells are not measured except the time of activation of the battery voltage measuring device, it is not possible to monitor the state of the high voltage battery sufficiently and reliably.

SUMMARY OF THE INVENTION

The present invention provides a state monitoring apparatus for an assembled battery constituted of a series connection of a plurality of battery cells comprising:

a high-voltage side monitoring section disposed in a high voltage system having the assembled battery to monitor a state of the assembled battery; and a low-voltage side monitoring section disposed in a low voltage system insulated from the high voltage system and configured to monitor the state of the assembled battery through communication with the high-voltage side monitoring section;

the high-voltage side monitoring section including:

a voltage measuring section configured to measure battery voltages of unit batteries each constituted of one or neighboring ones of the plurality of the battery cells;

a determining section configured to make a determination whether or not the battery voltages of all of the battery units measured by the voltage measuring section are within a predetermined range; and an informing section configured to transmit to the low-voltage side monitoring section a notification that the battery voltage of at least one of the unit batteries is abnormal if the determination made by the determining section is negative;

wherein the low-voltage side monitoring section is configured to obtain, upon reception of the notification, at least one of the battery voltages determined to be abnormal through communication with the high-voltage side monitoring unit.

According to the present invention, there is provided a state monitoring apparatus capable of reliably and sufficiently monitoring the state of an assembled battery disposed in a high voltage system on the side of a low voltage system through communication between the high voltage system and the low voltage system.

Other advantages and features of the invention will become apparent from the following description including the drawings and claims.

PREFERRED EMBODIMENTS OF THE INVENTION

First Embodiment

Figure 1:
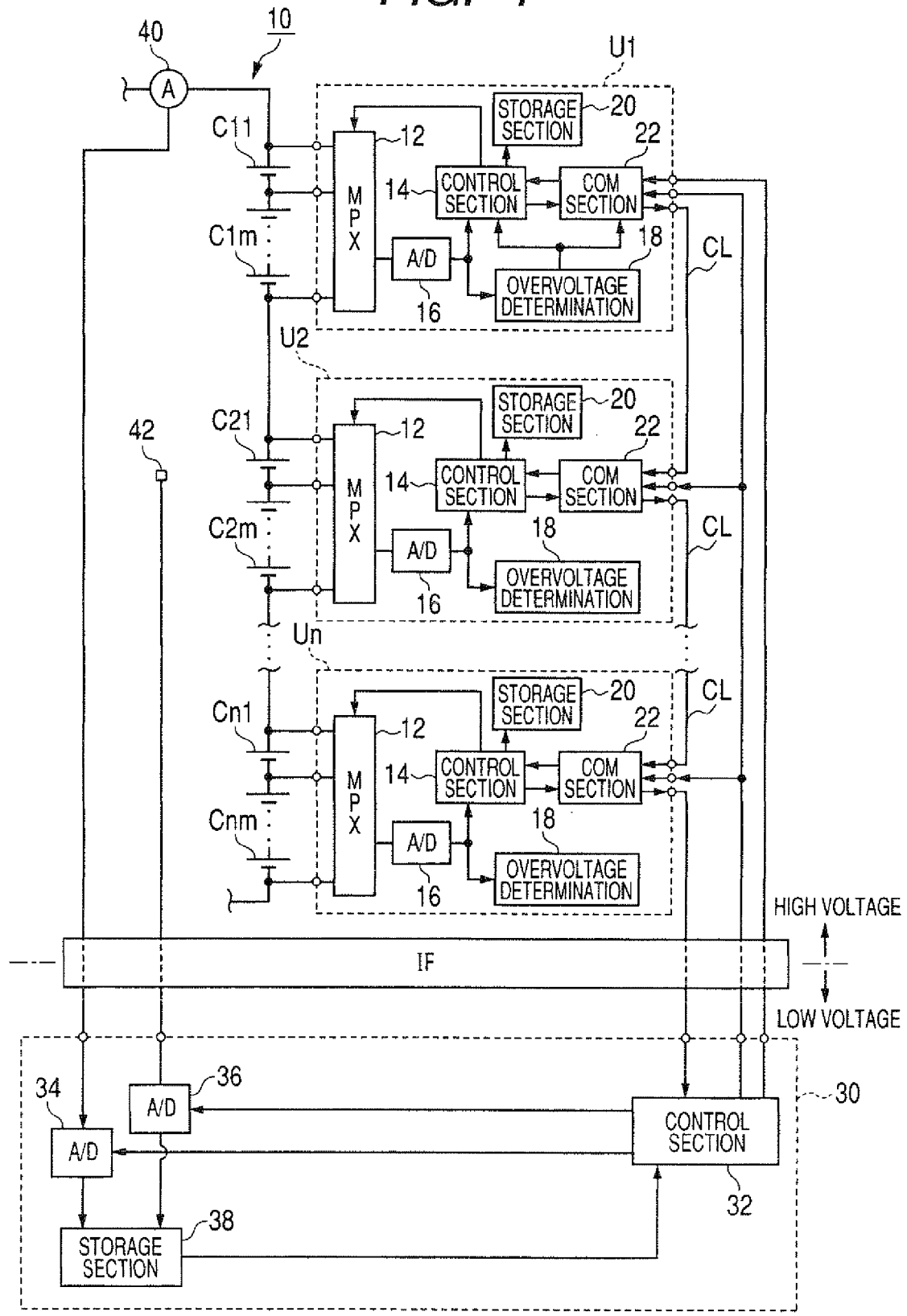
FIG. 1 is a diagram showing the structure of a state monitoring apparatus according to a first embodiment mounted on a hybrid vehicle to monitor an assembled battery.

FIG. 1 is a diagram showing the structure of a state monitoring apparatus according to a first embodiment mounted on a hybrid vehicle to monitor an assembled battery.

An assembled battery 10 constitutes a vehicle-mounted high voltage system isolated from a vehicle-mounted low voltage system. The assembled battery 10 is a secondary battery to supply electric power to an electric rotating machine as a vehicle main engine. In more detail, the assembled battery 10 is a series connection of battery cells $C_{ij}$ (i=1 to n, j=1 to m). The battery cells $C_{ij}$ are lithium ion secondary batteries.

The battery cells $C_{ij}$ are grouped into a plurality of blocks each constituted of a predetermined number (m) of neighboring battery cells. Each of the blocks (battery cells $C_{i1}$-$C_{im}$) is provided with a monitoring unit $U_i$.

The monitoring unit $U_i$ makes, by use of a multiplexer 12, a determination as to which one of the voltages of the battery cells $C_{i1}$ to $C_{im}$ should be outputted to an A/D converter 16 which converts an analog signal inputted thereto to digital data. The digital data outputted from the A/D converter 16 is compared in value with threshold value data at an overvoltage determining section 18. Here, the threshold value data for the overvoltage determination includes a larger threshold value for determining overvoltage and a smaller threshold value for determining undervoltage. A control section 14 operates the multiplexer 12, and store the digital data outputted from the A/D converter 16 in a storage section 20, in accordance with a command received from a control device 30 constituting the low voltage system through a communication section 22.

Each adjacent two of the monitoring units are connected to each other by a communication line CL. This is to allow all the monitoring units to constitute the low voltage system together, and to share a command signal transmitted to any one of the monitoring units from the control device 30 which monitors the state of the assembled battery 30. In this embodiment, when the control device 30 transmits a command signal to the most upstream monitoring unit (monitoring unit $U_1$), this command signal is transferred to the adjacent downstream monitoring unit in succession until it is received by the most downstream monitoring unit (monitoring unit $U_n$).

The control device 30 process digital data represented by discrete numeric values. The control device 30 includes a control section 32 from which a signal commanding to perform an overvoltage determining operation is transmitted to the most upstream monitoring unit $U_1$. The control device 30 converts the output of a current sensor 40 which measures the value of the current flowing through the assembled battery 10 into digital data at each timing designated by the control section 32. Also, the control device 30 converts the output of a temperature sensor 42 which measures the temperature of the assembled battery 10 into digital data at each timing designated by the control section 32. These converted digital data are stored in a storage section 38.

The control device 30 and the monitoring units are mutually isolated, signal exchange therebetween is performed through insulation elements such as photocouplers.

Figure 2:
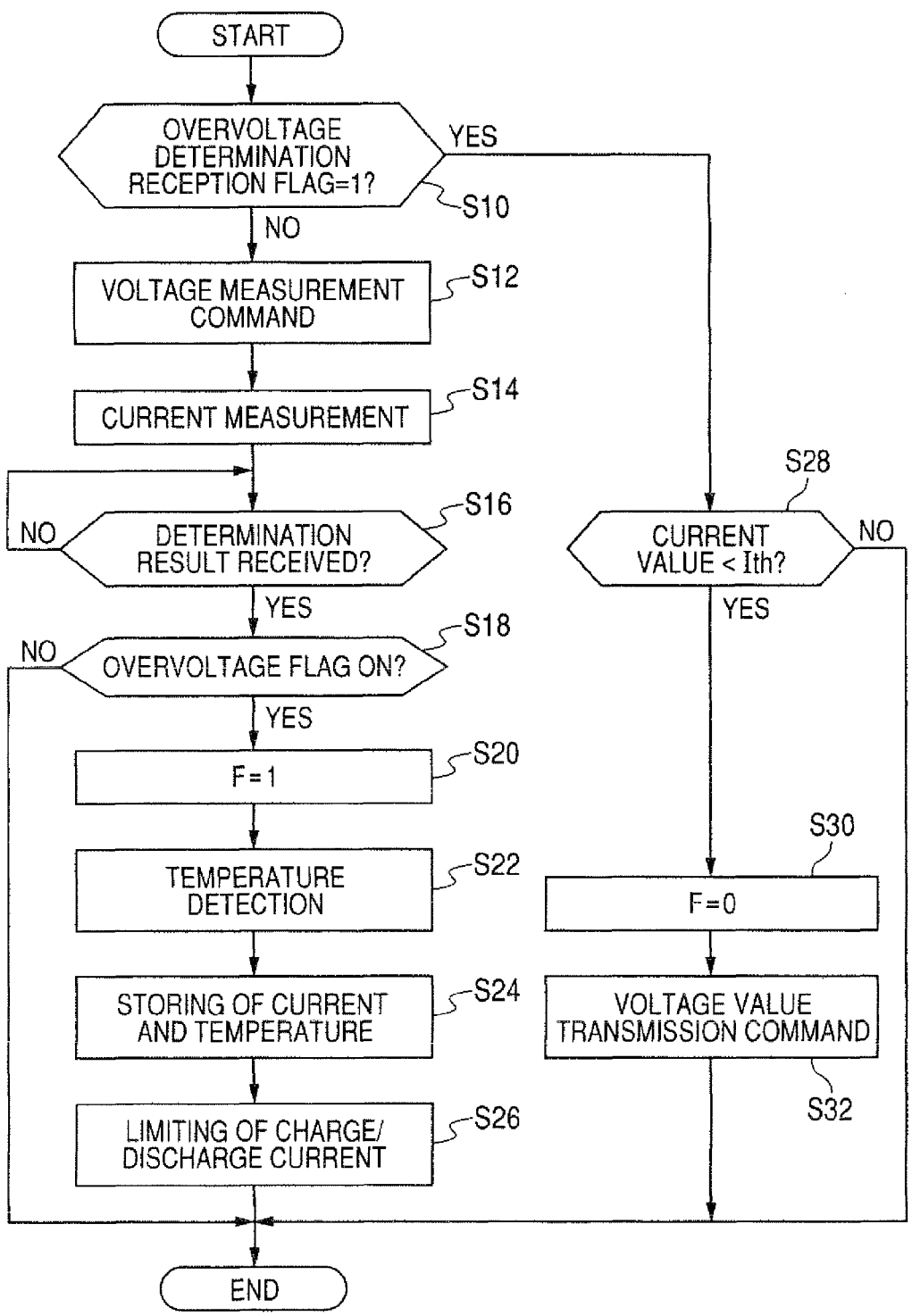
FIG. 2 is a flowchart showing operation to perform a monitoring process performed by a control device included in the state monitoring apparatus.

FIG. 2 is a flowchart showing an operation for determining presence or absence of a fault in each of the battery cells $C_{ij}$ performed by the control device 30. This operation is performed repeatedly at regular time intervals.

This operation begins by determining whether or not an overvoltage determination reception flag F is 1 at step S10. The overvoltage determination reception flag F shows, when it is 1, that the monitoring unit $U_i$ (at least one of the monitoring units $U_1$ to $U_n$) has detected the presence of overvoltage (may be referred to as "overvoltage presence determination" hereinafter), and shows, when it is 0, that the monitoring unit $U_i$ has not detected any overvoltage. If the determination result at step S10 is negative, the operation proceeds to step S12 to output a voltage measurement command signal to the most upstream monitoring unit $U_1$. As a result, all of the monitoring units $U_1$ to $U_n$ receive the voltage measurement command signal. Subsequently, at step 14, the current flowing through the assembled battery 10 is measured. Accordingly, it is possible to synchronize the timing at which the monitoring units $U_1$ to $U_n$ measure the voltages of the battery cells $C_{11}$ to $C_{nm}$ and the timing at which the current flowing through the assembled battery 10 is measured.

At subsequent step S16, the operation waits until a determination result signal (overvoltage flag) showing a result of the overvoltage determining operation is received from the most downstream monitoring unit $U_n$. When the overvoltage flag is received, the operation proceeds to step S18 to determine whether or not the overvoltage flag is ON. The overvoltage flag is set ON when at least one of the battery cells $C_{11}$ to $C_{nm}$ is in the overvoltage state, and set OFF when none of the battery cells $C_{11}$ to $C_{nm}$ is in the overvoltage state. If the determination result at step S18 is affirmative, the operation proceeds to step S20 to set the overvoltage determination reception flag F to 1. At subsequent step S22, the temperature of the assembled battery 10 is measured. Subsequently, at step S24, the current measured at step S14 and the temperature measured at step S22 are stored.

Subsequently, at step S26, an operation to limit the charge/discharge current of the assembled battery 10 is carried out. This limiting operation is for preventing the voltage of each battery cell $C_{ij}$ from becoming excessively large or small. The terminal voltage of each battery cell $C_{ij}$ is a sum of the open terminal voltage depending on the charged amount (SOC) and the product of its internal resistance and current. Accordingly, by limiting the charge/discharge current (or by reducing the allowable range of the absolute value of the charge/discharge current), it is possible to prevent the voltages of each battery cell $C_{ij}$ from becoming excessively large or small. This limiting operation may be carried out by estimating the internal resistance on the basis of the charge/discharge current measured at step S14, the SOC, and the threshold value for overvoltage determination, and then calculating a current value which does not cause overvoltage with the estimated internal resistance.

If the determination result at step S10 is affirmative, the operation proceeds to step S28 to determine whether or not the current flowing through the assembled battery 10 has become smaller than a threshold current Ith. Step S28 is provided for determining whether or not the current limiting operation at step S26 is in effect. The threshold current Ith may be the upper limit value set by the current limiting operation.

If the determination result at step S28 is affirmative, the operation proceeds to step S30 to set the overvoltage determination reception flag F to 0. At subsequent step S32, a command signal to transmit the voltages of each battery cell Cij is transmitted to the most upstream monitoring unit Ui.

When step S26 or S32 is completed, or if the determination result at step s18 or step S28 is negative, this operation is terminated.

Figure 3:
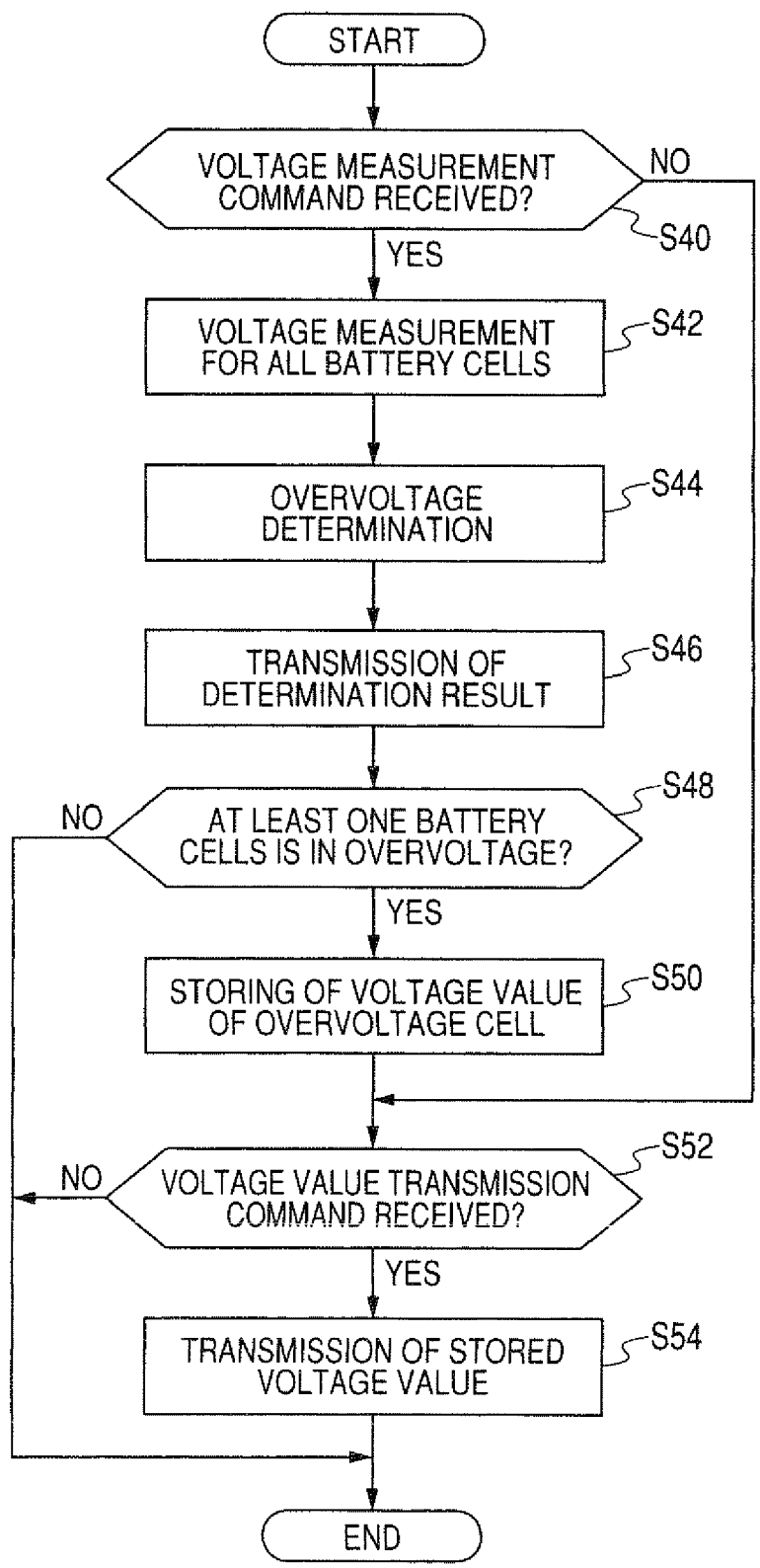
FIG. 3 is a flowchart showing operation to perform the monitoring process performed by monitoring units included in the state monitoring apparatus.

FIG. 3 is a flowchart showing an operation performed by the monitoring units U1 to Un. This operation is performed repeatedly at regular time intervals.

This operation begins by determining at step S40 whether or not the voltage measurement command signal transmitted from the control device 30 at step S10 shown in FIG. 2 has been received. If the determination result at step S40 is affirmative, the operation proceeds to step S42 to measure the voltages of all the battery cells C11 to Cnm. In this step S42, each monitoring unit Ui measures the voltages of all the battery cells Ci1 to Cim in its block. At subsequent step S44, it is determined whether or not at least one of the voltages of the battery cells C11 to Cnm is outside the range between the smaller threshold value and the larger threshold value. In this embodiment, the larger threshold value is set smaller than the open terminal voltage of each battery cell Cij when it is charged to a predetermined allowable maximum level (for example, to the level in which the SOC is 80%). Likewise, the smaller threshold value is set larger than the open terminal voltage of each battery cell Cij when it is charged to a predetermined allowable minimum level (for example, to the level in which the SOC is 30%). These settings are made for the purpose of rapidly informing the control device 30 of whether there is possibility of a fault in at least one of the battery cells Cij after each monitoring unit Ui determines presence or absence of overvoltage.

At subsequent step S46, the determination result at step S44 is transmitted to the control device 30.

Actually, steps S44 and S46 are performed as follows.

(a) Each monitoring unit Ui determines whether or not at least one of the voltages of the battery cells Ci1 to Cim is outside the range between the smaller and larger threshold values.

(b) The monitoring unit U1 outputs the determination result to the monitoring unit U2.

(c) Each of the monitoring units U2 to Un generates and outputs a logically combined signal of the signal outputted from the upstream adjacent monitoring unit and a signal indicative of the determination result by itself. Accordingly, the signal outputted from the most downstream monitoring unit Un shows whether or not at least one of the voltages of the battery cells C11 to Cnm constituting the assembled battery 10 is outside the range determined by the threshold values.

After completion of step S46, the operation proceeds to step S48 to determine whether or not at least one of the battery cells Cij is in the overvoltage state. If the determination result at step S48 is affirmative, the operation proceeds to step S50 where the value of the voltage the battery cell determined to be in the overvoltage stage is stored in the storage section 20. At subsequent step S52, the operation waits until the voltage value transmission command signal outputted from the control device at step S32 shown in FIG. 2 is received. Upon reception of the voltage value transmission command signal, the operation proceeds to step S54 to transmit the voltage values stored in the storage section 20 at step S54 to the control device 30.

As a result, the control section 32 of the control device 30 can make an analysis on presence or absence of a fault in the battery cell Cij having been determined to be in the overvoltage state. This analysis may include the followings.

(a) Estimating the open terminal voltage of the battery cell Cij from the estimated charged amount, and estimating the internal resistance R from the temperature stored at step S24.

(b) Estimating the terminal voltage at the time of measuring the voltage of the battery cell Cij, by adding the estimated open terminal voltage to the product of the current stored at step S24 and the estimated internal resistance.

(c) Determining presence or absence of a fault in the battery cell Cij on the basis of the comparison between the estimated terminal voltage and the measured voltage, and identifying the cause of the fault.

When the charge/discharge current of the assembled battery 10 is excessively large at the time of measuring the voltage of the battery cell Cij, for example, there is a possibility that the estimated voltage exceeds the terminal voltage even if the state of charge of the battery cell Cij is within the allowable range. Accordingly, in this case, it may be determined that there is no fault if the difference between the estimated voltage and the measured voltage is small. Further, when the measured voltage is excessively larger than the estimated voltage, it may be determined that there is a fault that the internal resistance is abnormally large. It is possible to calculate the difference between the estimated internal resistance and the actual internal resistance on the basis of the estimated voltage and the measured voltage. Accordingly, since the actual internal resistance can be calculated, it is possible to calculate the upper and lower limits of the charge/discharge current of the assembled battery 10 thereafter in order to prevent overvoltage on the basis of the actual internal resistance.

When step S54 is completed, or if the determination result at step S48 or S52 is negative, the operation is terminated.

As explained above, according to this embodiment, it is possible for the control device 30 to quickly ascertain possibility of a fault in the battery cell Cij by transmitting the determination result by the monitoring unit Uj with respect to presence or absence of overvoltage to the control device 30. When it is determined that there is a possibility of a fault in the battery cell Cij on the basis of the determination result indicating presence of overvoltage by the monitoring unit Ui, it is possible for the control device 30 to make a precise analysis on presence or absence of a fault in the battery cell Cij by acquiring voltage value data of the battery cell Cij. The amount of data showing the determination result by the monitoring unit Ui is small. Accordingly, the amount of data transmitted successively from the monitoring unit Ui to the control device 30 can be made small. Further, since the control device 30 analyzes whether the battery cell Cij is faulty after overvoltage is detected, it is possible to set the threshold value for overvoltage determination to a more exacting value so that overvoltage is detected more easily.

The embodiment described above provides the following advantages.

(1) Each monitoring unit Ui determines presence or absence of overvoltage of the battery cell Cij, and the determination result is successively transmitted to the control device 30. The control device 30 obtains the voltage value of the battery cell Cij if the determination result indicates presence of overvoltage. This makes it possible to reduce transmission data amount compared to a case where the voltage value measured by each monitoring unit Ui is transmitted to the control device 30, and the control device 30 makes determination of presence or absence of overvoltage on the basis of the received voltage value.

(2) The current flowing through the assembled battery 10 is measured in synchronization with the timing at which the monitoring unit Ui carries out the voltage measurement to determine presence or absence of overvoltage, and the measured current is stored in the control device 30. This makes it possible for the control device 30 to accurately identify the state of the battery cell Cij.

(3) The control device 30 analyzes the state of the battery cell Cij on the basis of the measured voltage value transmitted from the monitoring unit Ui and the current value measured in synchronization with the measurement of the voltage value. This makes it possible to keep track of the state of the battery cell Cij with high degree of accuracy.

(4) Each monitoring unit Ui analyzes the state of the battery cell Cij having been determined to be in the overvoltage state, while taking into account of the temperature of the battery cell Cij This makes it possible to make a precise analysis of the state of the battery cell Cij.

(5) The control device 30 carries out the operation to limit the charge/discharge current of the assembled battery 10 if the determination result transmitted from the monitoring unit Ui indicates presence of overvoltage. This makes it possible to prevent the battery cell Cij from being erroneously determined to be faulty.

(6) Each monitoring unit Ui transmits the measurement value of the voltage of the battery cell Cij to the control device 30 on condition that the operation to limit the charge/discharge current of the assembled battery 10 has been carried out. This makes it possible to prevent the battery cell Cij from entering the overvoltage state.

Second Embodiment

Next, a second embodiment of the invention is described with particular emphasis on the difference with the first embodiment.

In the second embodiment, the control device 30 transmits a command to each monitoring unit Ui to hold the voltage of each battery cell Cij, so that all of the voltages of the battery cells C11 to Cnm are held.

Figure 4:
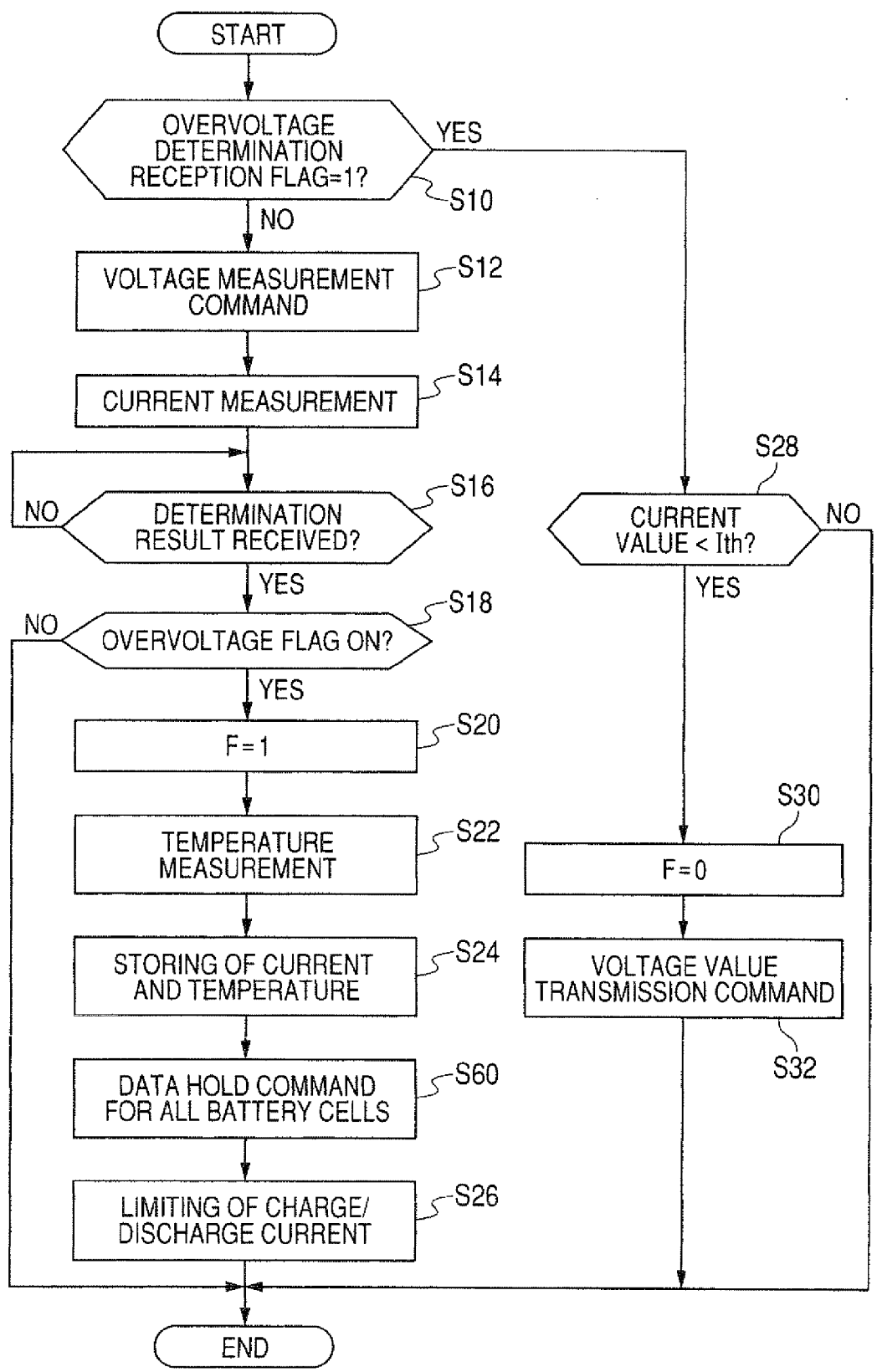
FIG. 4 is a flowchart showing operation to perform a monitoring process performed by a control device included in a state monitoring apparatus according to a second embodiment of the invention.

FIG. 4 is a flowchart showing an operation to determine presence or absence of a fault in the battery cell Cij performed by the control device 30. This operation is performed, repeatedly at regular time intervals. In FIG. 4, the steps that are the same as those shown in FIG. 2 are referred to by the same step numbers.

In this operation, when the overvoltage flag F is determined to be ON (YES at step S18), a command to hold the voltages of all the battery cells Cij is transmitted to the monitoring units U1 to Un at step S60.

Figure 5:
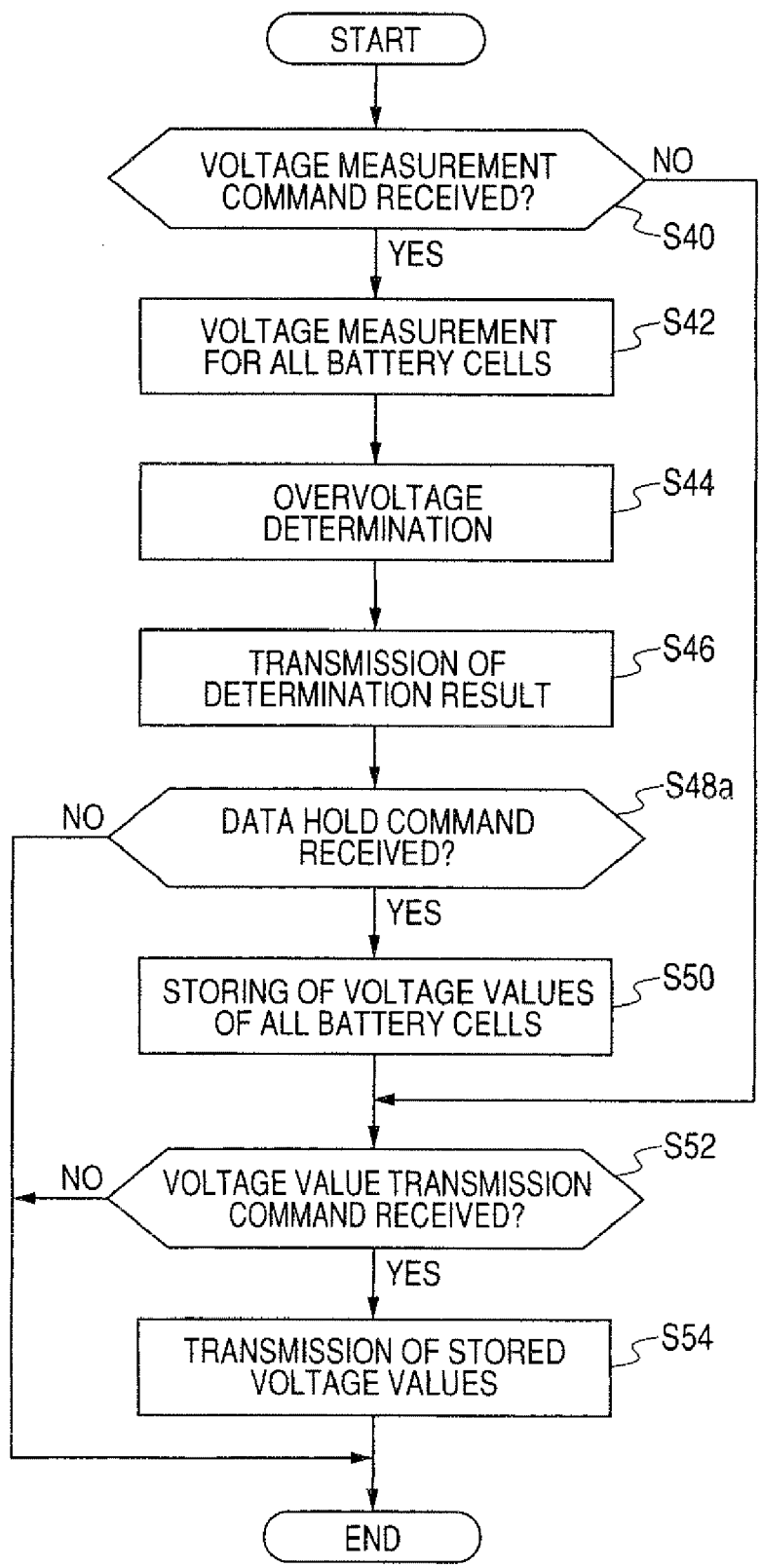
FIG. 5 is a flowchart showing operation to perform the monitoring process performed by monitoring units included in the state monitoring apparatus according to the second embodiment of the invention.

FIG. 5 is a flowchart showing an operation performed by the monitoring units U1 to Un. This operation is performed repeatedly at regular time intervals. In FIG. 5, the steps that are the same as those shown in FIG. 3 are referred to by the same step numbers.

In this operation, after the determination result on presence or absence of overvoltage is transmitted at step S46, it is determined whether or not a data hold command has been received at step S48a. If the determination result at step S48a is affirmative, the measured voltages of all the battery cells C11 to Cnm are held at step S42.

The second embodiment described above provides the similar advantages as those provided by the first embodiment.

Third Embodiment

Next, a third embodiment of the invention is described with particular emphasis on the difference with the second embodiment.

Figure 6:
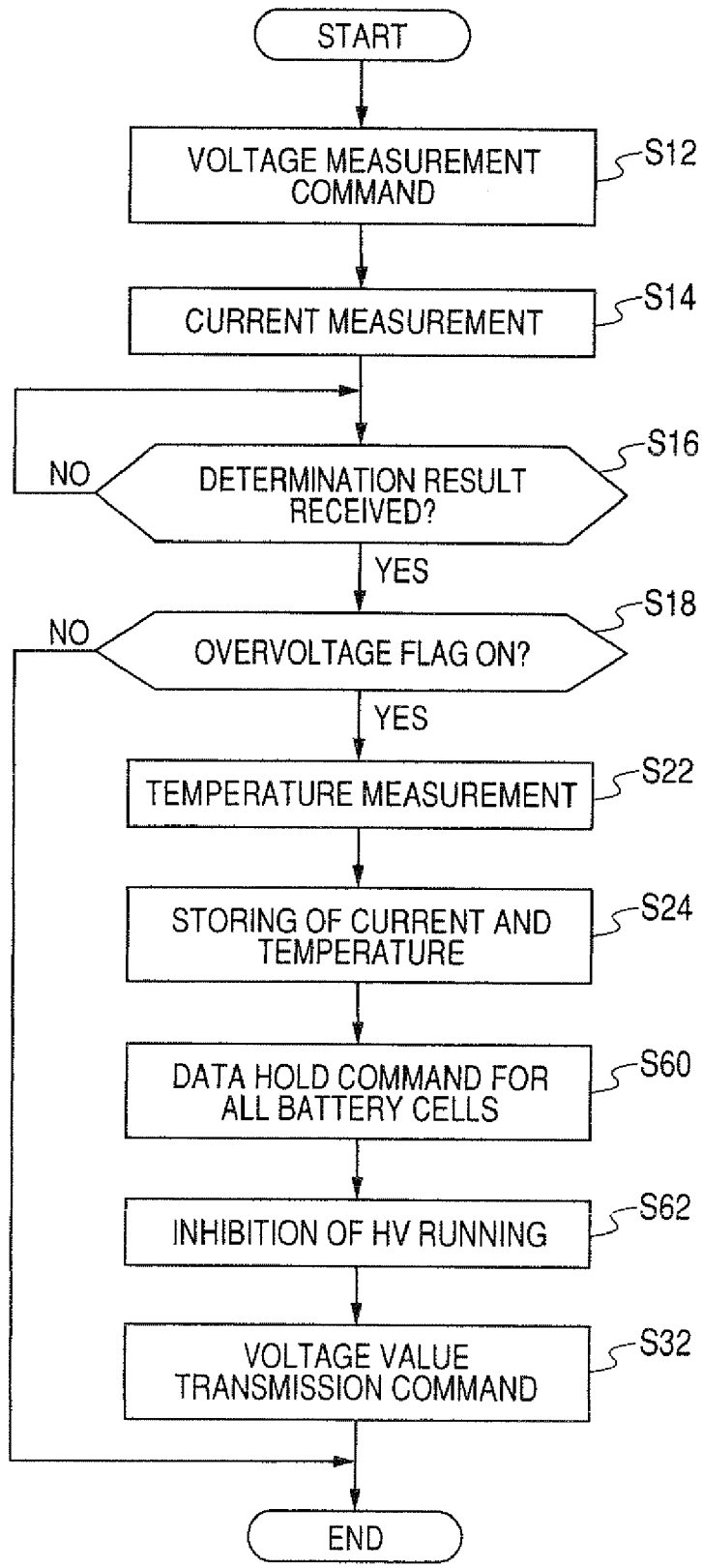
FIG. 6 is a flowchart showing operation to perform a monitoring process performed by a control device included in a state monitoring apparatus according to a third embodiment of the invention.

FIG. 6 is a flowchart showing an operation to determine presence or absence of a fault in the battery cell Cij performed by the control device 30. This operation is performed repeatedly at regular time intervals. In FIG. 6, the steps that are the same as those shown in FIG. 4 are referred to by the same step numbers.

In this operation, a command to hold the voltages of all the battery cells C11 to Cnm are issued at step S60, and the electric rotating machine connected to the assembled battery 10 through a power converter is stopped to inhibit HV running at step S62. As a result, since the current flowing through the assembled battery 10 decreases, it is possible to prevent occurrence of overvoltage. Incidentally, when the current value stored at step S24 indicates that the assembled battery 10 is being discharged, the vehicle may be inhibited from running only when the electric rotating machine drives the vehicle. That is, in this case, the vehicle may be shifted to a mode in which the internal combustion engine drives the vehicle. Further, when the current value stored at step S24 indicates that the assembled battery 10 is being charged, a vehicle alternator to generate power to charge the assembled battery 10 may be stopped.

Incidentally, when step S82 is completed, the monitoring unit Ui is commanded at step S32 to transmit the voltage value.

The third embodiment described above provides the similar advantages as those provided by the first embodiment.

Fourth Embodiment

Next, a fourth embodiment of the invention is described with particular emphasis on the difference with the second embodiment.

Figure 7:
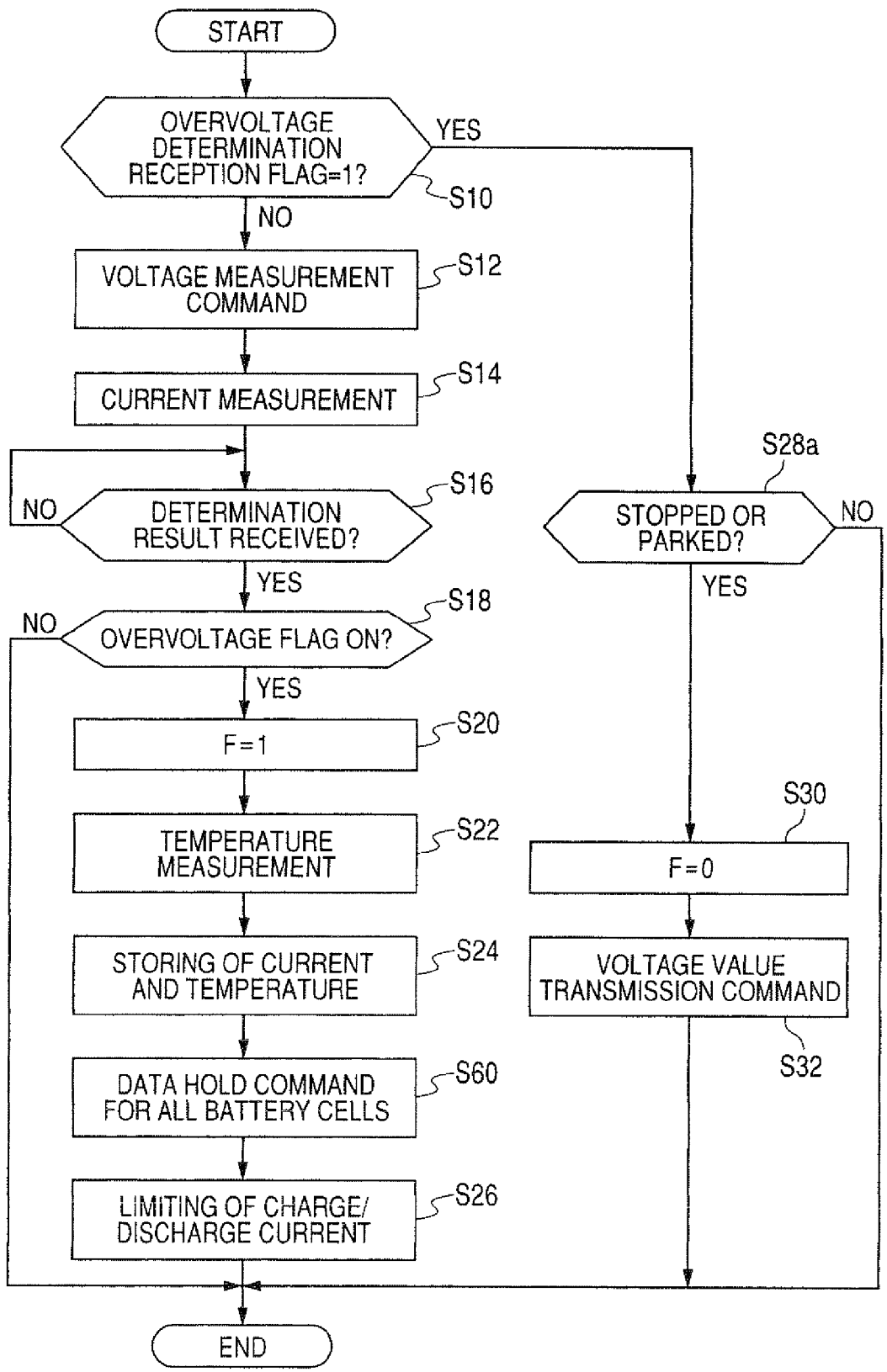
FIG. 7 is a flowchart showing operation to perform a monitoring process performed by a control device included in a state monitoring apparatus according to a fourth embodiment of the invention.

FIG. 7 is a flowchart showing an operation to determine presence or absence of a fault in the battery cell Cij performed by the control device 30. This process is performed repeatedly at regular time intervals. In FIG. 7, the steps that are the same as those shown in FIG. 4 are referred to by the same step numbers.

This operation begins by determining at step S28a whether or not the vehicle is stopped or parked, if the overvoltage determination reception flag F is determined to be 1 at step S10. Step S28a is provided for determining whether or not it is the timing for each monitoring unit Ui to transmit data regarding the voltage values of the battery cells C11 to Cnm to the control device 30. When the vehicle is stopped or parked, sine the current flowing through the assembled battery 10 is small and does not vary much, each battery cell Cij does not enter the overvoltage state, and the computation load of the control device 30 is small because the amount of communication data exchanged between each monitoring unit Ui and the control device 30 is small. Accordingly, the voltage value data of the battery cells C11 to Cnm is transmitted when the vehicle is stopped or parked.

The fourth embodiment described above provides the similar advantages as those provided by the first embodiment.

Fifth Embodiment

Next, a fifth embodiment of the invention is described with particular emphasis on the difference with the second embodiment.

Figure 8:
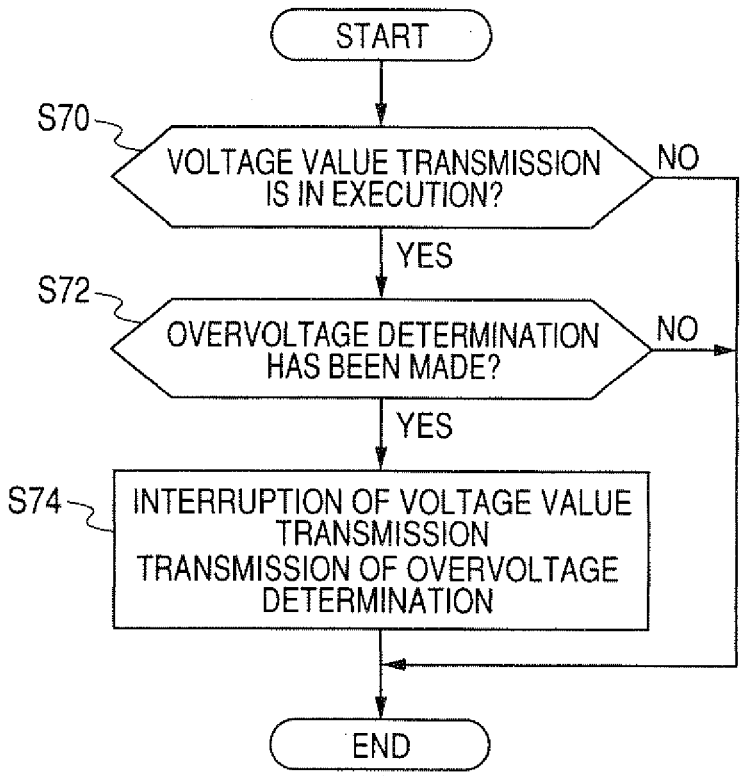
FIG. 8 is a flowchart showing operation to discontinue voltage value data transmission performed by monitoring units included in a state monitoring apparatus according to a fifth embodiment of the invention.

FIG. 8 is a flowchart showing a part of an operation performed by each monitoring unit Ui. This operation is performed repeatedly at regular time intervals.

In this operation, it is determined at step S70 whether or not the data transmitting operation to transmit data regarding the voltage values of the battery cells C11 to Cnm is in execution. If the determination result at step S70 is affirmative, the operation proceeds to step S72 to determine whether or not at least one of the battery cells C11 to Cnm has been determined to be in the overvoltage state. This determination is made because after the control device 30 transmits to each monitoring unit Ui the command to transmit voltage value data, the control device 30 further transmits to each monitoring unit Ui the voltage measurement command.

If the determination result at step S72 is affirmative, the operation proceeds to step S74 to discontinue the voltage value transmitting operation, and to transmit the determination result indicating presence of overvoltage to the control device 30.

When step S74 is completed, or if the determination result at step S70 or S72 is negative, this operation is terminated. It is preferable to resume the operation to transmit the voltage values after the determination result indicating presence of overvoltage is transmitted.

Figure 9:
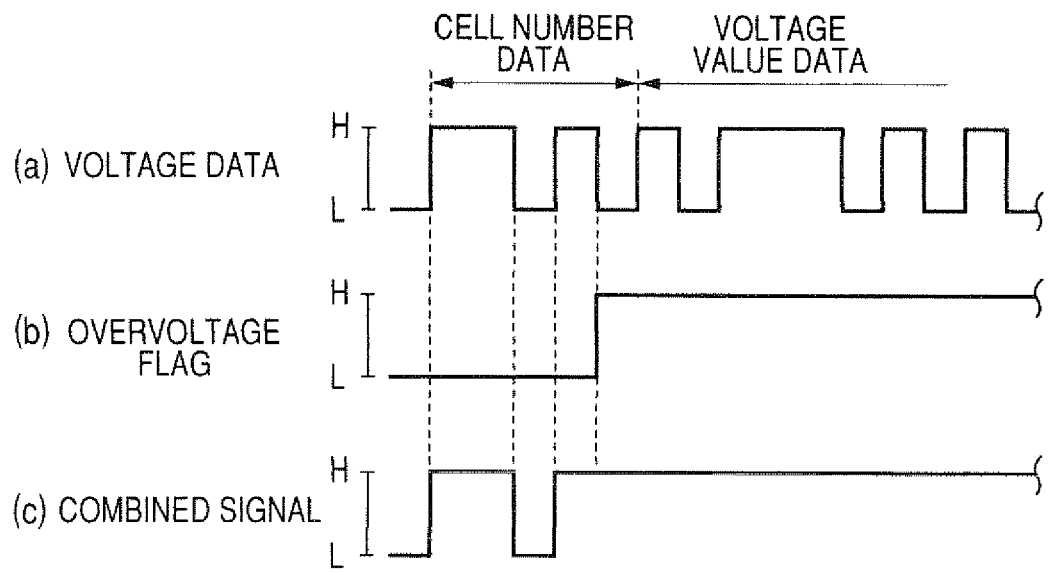
FIG. 9 is a time chart showing a method to transmit voltage value data and overvoltage flag performed in the state monitoring apparatus according to the fifth embodiment of the invention.

FIG. 9 is a diagram showing examples of voltage data, overvoltage flag data, and their combined signal transmitted from each monitoring unit Ui (more exactly, from the monitoring unit Un) to the control device 30. In more detail, the section (a) of FIG. 9 shows an example of the temporal transition of the voltage data, the section (b) of FIG. 9 shows an example of the temporal transition of the overvoltage flag data, and the section (c) of FIG. 9 shows an example of the temporal transition of a combined signal of the voltage data and the overvoltage flag data.

As shown in FIG. 9, the voltage value data is constituted of cell number data and voltage value data. These data are binary data. The cell number data takes values of 0 and 1. Also, the overvoltage flag data takes values of 0 and 1. However, the durations of the value 0 and 1 are longer than those of the cell number data. This makes it possible that the combined signal serves as the voltage data when there is no overvoltage, and serves as the overvoltage flag data when there is overvoltage. Accordingly, according to this embodiment, if the operation to transmit the voltage data is interrupted on the way, and the overvoltage flag data is transmitted instead, it is possible for the control device 30 to identify the overvoltage flag data.

The fifth embodiment described above provides in addition to the similar advantages as those provided by the first embodiment, the following advantage.

(7) When an overvoltage determination is made afresh during transmission of the voltage data, the transmission of the voltage data is discontinued, and the control device 30 is informed that overvoltage has been detected again. This makes it possible for the control device 30 to quickly handle the fault state.

Sixth Embodiment

Next, a sixth embodiment of the invention is described with particular emphasis on the difference with the first embodiment.

Figure 10:
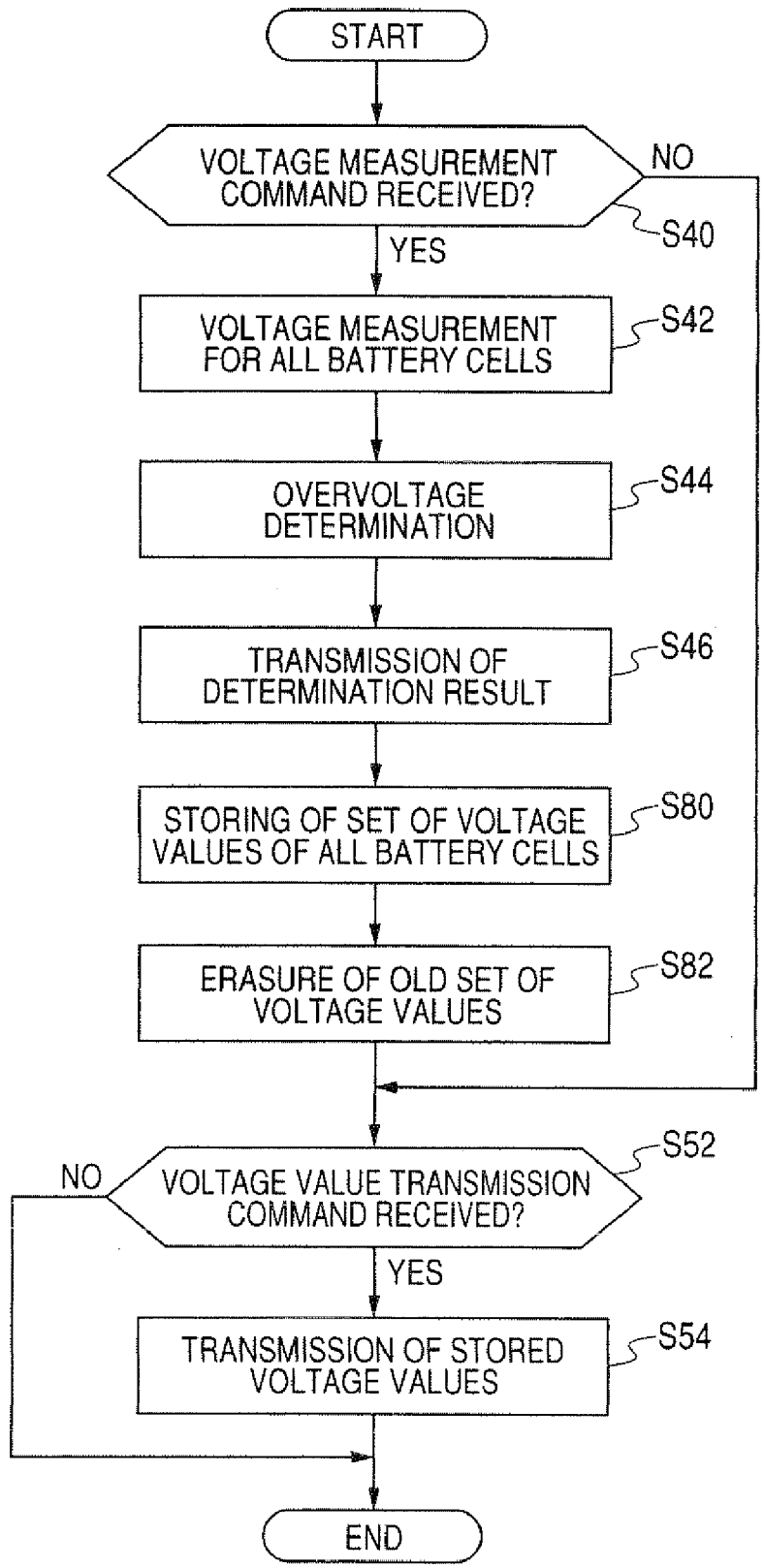
FIG. 10 is flowchart showing operation to perform a monitoring process performed by monitoring units included in a state monitoring apparatus according to a sixth embodiment of the invention.

FIG. 10 is a flowchart showing a part of an operation performed by each monitoring unit Ui. This operation is performed repeatedly at regular time intervals. In FIG. 10, the steps that are the same as those shown in FIG. 3 are referred to by the same step numbers.

In this operation, after the determination result on presence or absence of overvoltage is transmitted at step S46, the voltage values of all the battery cells C11 to Cnm are stored at step S80.

At subsequent step S82, the older ones of the stored voltage values are erased so that p (p being a predetermined integer larger than 1) sets of the voltage values of the battery cells C11 to Cnm measured at p consecutive timings are stored at of each monitoring unit Ui to make a determination on presence or absence of overvoltage. When the command to transmit the voltage values is issued from the control device 30 at step S52, the p sets of the stored voltage values of the battery cells C11 to Cnm are transmitted to the control device 30 at step S54.

According to the above operation, when overvoltage is detected, the control section 32 of the control device 30 can analyze the cause in detail. For example, if the voltage of the battery cell Cij is superimposed with noise, and as a result the battery cell Cij is determined to be in the overvoltage state, the voltage of the battery cell Cij changes sharply after this determination. According to the above operation, it is possible to judge that the determination was erroneously made due to temporal voltage variation in such a case. Further, when the voltages of most of the battery cells are increasing with time, it is possible to judge that their resistances have been deteriorated considerably.

The sixth embodiment described above provides in addition to the similar advantages as those provided by the first embodiment, the following advantage.

(8) If a determination indicating that overvoltage is present is made, the measured voltage value as a basis of the determination, and the voltage values measured at the previous timings are transmitted together from the monitoring unit Ui to the control device 30 so that the control device 30 can evaluate the reliability of the overvoltage determination in accordance with the temporal variation of the voltage. This makes it possible to analyze the state of the battery cell Cij with a high degree of accuracy.

It is a matter of course that various modifications can be made to the above embodiments as described below.

In the first embodiment, when one of the battery cells is detected to be in the overvoltage state, not only the voltage value of this detected battery cell, but the voltage values of all the battery cells may be stored together with their identification data.

The first embodiment may be modified in the same way in which the third embodiment is modified from the second embodiment.

The first embodiment may be modified in the same way in which the fourth embodiment is modified from the second embodiment.

The third and fourth embodiment may be modified in the same way in which the fifth embodiment is modified from the second embodiment. Also, the first embodiment may be modified in the same way in which the fifth embodiment is modified from the second embodiment. However, in this case, it is preferable to transmit the cell number data identifying the battery cell determined to be in the overvoltage state when the voltage values are transmitted from the monitoring unit Ui, while providing the cell number data with a function of enabling to be distinguished from the overvoltage flag data.

In the fifth embodiment, each voltage data is added with the cell number data. However, instead, data indicating start of the voltage data may be inserted between each pair of the voltage data. Also in this case, it is possible to provide the data indicating start of the voltage data with the function enabling to be distinguished from the overvoltage flag data.

The third to fifth embodiment may be modified in the same way in which the sixth embodiment is modified from the second embodiment.

The first to sixth embodiments are configured such that once each monitoring unit Ui detects overvoltage, the control device 30 does not issue the voltage measurement command before it issues the voltage value transmission command. However, this configuration is not compulsory.

Each of the above embodiments is configured such that each adjacent two of the monitoring units are communicably connected to each other, so that by transmitting the voltage measurement command to the most upstream monitoring unit U1, this voltage measurement command is supplied in succession to all of the other monitoring units up to the most downstream monitoring unit Un. However, they are not limited thereto. For example, the control device 30 may transmit the voltage measurement command to each of the monitoring units. In this case, each monitoring unit Ui may independently transmit the determination result on presence or absence of overvoltage and data showing the voltage values of corresponding ones of the battery cells Ci1 to Cim to the control device 30.

Each of the above embodiments is configured such that when the voltage measurement command is issued, the voltages of all the battery cells Ci1 to Cim in each block are measured. However, they are not limited thereto. For example, they may be configured such that when the voltage measurement command is issued, the voltage of only one of the battery cells Ci1 to Cim in each block is measured. In this case, the voltage measuring timing and the current measuring timing can be synchronized more precisely.

In each of the above embodiments, the threshold value used to make a determination of overvoltage is a fixed value stored in each monitoring unit Ui. However, the threshold value may be variably set in accordance with the current flowing through the assembled battery 10. This is possible, for example, by causing the control device 30 to transmit a signal indicative of the value of the current flowing through the assembled battery 10, or a threshold value depending on the value of the current. In this case, the voltage measuring timing and the current measuring timing can be synchronized precisely by delaying the voltage measuring timing with respect to the timing of transmitting such a signal or a threshold value.

In each of the above embodiments, the control device 30 analyzes the state of the battery cell Cij determined to be in the overvoltage state by referring to the current data and temperature data. However, the control device 30 may analyze the state of the battery cell Cij by referring to only the current data. Even in this case, it is possible to precisely analyze the state of the battery cell determined to be in the overvoltage state if the voltage measuring timing is limited to a specific running state of the vehicle, because the temperature of the assembled battery 10 is within a limited range in the specific running state.

In each of the above embodiments, the current measuring timing and the voltage measuring timing are synchronized with each other. However, they are not limited thereto. For example, in a steady state in which variation of the current flowing through the assembled battery 10 is below a predetermined value, deviation between the current measuring timing and the voltage measuring timing is small even if they are not synchronized intentionally. Accordingly, it is possible to precisely analyze the state of the battery cell Cij determined to be in the overvoltage state on the basis of the measured current and measured voltage without synchronizing means.

In each of the above embodiments, determination on presence or absence of a fault is made by use of the threshold value set in accordance with the open terminal voltage of each battery cell Cij charged to a predetermined allowable level. However, they are not limited thereto. For example, the threshold value may be set to the open terminal voltage of each battery cell Cij charged beyond the allowable level. In this case, the control device 30 may make a determination on presence or absence of a fault without analyzing the state of the battery cell determined to be in the overvoltage state. Also in this case, the advantages that battery cell information indicating presence of a fault can be easily obtained at an automobile dealer, for example, by transmitting the voltage values from the monitoring unit to the control device 30.

The battery cell Cij is not limited to a lithium ion secondary battery. The measurement object is not limited to the voltage of the respective single battery cell Cij. For example, it may be the voltage of the respective adjacent two or more battery cells as a unit battery.

The assembled battery 10 is not limited to the one for use in a hybrid vehicle. For example, it may by the one for use in an electric vehicle which has an electric rotating machine as a sole main engine thereof.

The above explained preferred embodiments are exemplary of the invention of the present application which is described solely by the claims appended below. It should be understood that modifications of the preferred embodiments may be made as would occur to one of skill in the art.

What is claimed is:

1. A state monitoring apparatus for an assembled battery constituted of a series connection of a plurality of battery cells comprising:
   a high-voltage side monitoring section disposed in a high voltage system having the assembled battery to monitor a state of the assembled battery; and
   a low-voltage side monitoring section disposed in a low voltage system insulated from the high voltage system and configured to monitor the state of the assembled battery through communication with the high-voltage side monitoring section;
   the high-voltage side monitoring section including:
   a voltage measuring section configured to measure battery voltages of unit batteries each constituted of one or neighboring ones of the plurality of the battery cells;
   a determining section configured to make a determination whether or not the battery voltages of all of the battery units measured by the voltage measuring section are within a predetermined range; and
   an informing section configured to transmit to the low-voltage side monitoring section a notification that the battery voltage of at least one of the unit batteries is abnormal if the determination made by the determining section is negative;
   wherein the low-voltage side monitoring section is configured to obtain, upon reception of the notification, at least one of the battery voltages having been determined to be abnormal through communication with the high-voltage side monitoring unit.

2. The state monitoring apparatus according to claim 1, further comprising a current measuring section configured to measure a battery current flowing through the assembled battery, and a synchronizing section configured to synchronize a first timing at which the voltage measuring section measures the battery voltages and a second timing at which the current measuring section measures the battery current,
   the determining section being configured to make the determination on the basis of the battery voltages measured at the first timing synchronized with the second timing by the synchronizing section.

3. The state monitoring apparatus according to claim 2, wherein the low-voltage side monitoring section includes an analyzing section configured to make an analysis of states of the unit batteries on the basis of the battery voltages and the battery current measured respectively at the first timing and the second timing synchronized with each other.

4. The state monitoring apparatus according to claim 3, further comprising a temperature measuring section configured to measure temperature of the assembled battery, the analyzing section being configured to make the analysis taking into account the temperature of the assembled battery measured by the temperature measuring section when the battery voltages are measured by the voltage measuring section.

5. The state monitoring apparatus according to claim 2, wherein the low-voltage side monitoring section includes:
   an acquiring section configured to acquire, when the low-voltage side monitoring section receives the notification, a first value and a second value of the battery voltage of the unit battery having been determined to be abnormal, the first value being measured at the first timing, the second value being measured at a timing preceding the first timing; and
   an evaluating section configured to evaluate reliability of the notification on the basis of temporal variation of the battery voltage shown by a difference between the first and second values.

6. The state monitoring apparatus according to claim 1, wherein the low-voltage side monitoring section includes a limiting section configured to limit a charge/discharge current of the assembled battery when the low-voltage side monitoring section receives the notification.

7. The state monitoring apparatus according to claim 6, wherein the low-voltage side monitoring section is configured to obtain the battery voltages of the unit batteries from the high-voltage side monitoring section after the limiting section limits the charge/discharge current of the assembled battery.

8. The state monitoring apparatus according to claim 1, wherein the high-voltage side monitoring section is configured to discontinue transmission of the voltage values of the battery voltages of the unit batteries to the low-voltage side monitoring section if the determination made by the determining section is negative during a period of the transmission, and instead, transmits the notification to the low-voltage side monitoring section.

* * * * *